US010217524B2

(12) United States Patent
Falanga et al.

(10) Patent No.: US 10,217,524 B2
(45) Date of Patent: Feb. 26, 2019

(54) AUTORECOVERY AFTER MANUFACTURING/SYSTEM INTEGRATION

(71) Applicant: MICRON TECHNOLOGY, INC., Boise, ID (US)

(72) Inventors: Francesco Falanga, Pozzuoli (IT); Victor Tsai, Palo Alto, CA (US)

(73) Assignee: Micron Technology, Inc., Boise, ID (US)

(*) Notice: Subject to any disclaimer, the term of this patent is extended or adjusted under 35 U.S.C. 154(b) by 40 days.

(21) Appl. No.: 15/412,148

(22) Filed: Jan. 23, 2017

(65) Prior Publication Data
US 2017/0133105 A1 May 11, 2017

Related U.S. Application Data

(63) Continuation of application No. 14/552,863, filed on Nov. 25, 2014, now Pat. No. 9,552,895, which is a continuation of application No. 13/767,389, filed on Feb. 14, 2013, now Pat. No. 8,904,250.

(51) Int. Cl.
| | |
|---|---|
| *G11C 29/00* | (2006.01) |
| *G11C 29/38* | (2006.01) |
| *G11C 16/34* | (2006.01) |
| *G11C 29/52* | (2006.01) |
| *G11C 29/44* | (2006.01) |
| *G11C 16/04* | (2006.01) |
| *G11C 29/36* | (2006.01) |
| *G11C 29/04* | (2006.01) |

(52) U.S. Cl.
CPC ......... *G11C 29/38* (2013.01); *G11C 16/0483* (2013.01); *G11C 16/3418* (2013.01); *G11C 29/36* (2013.01); *G11C 29/4401* (2013.01); *G11C 29/52* (2013.01); *G11C 2029/0407* (2013.01); *G11C 2029/0409* (2013.01)

(58) Field of Classification Search
None
See application file for complete search history.

(56) References Cited

U.S. PATENT DOCUMENTS

| | | |
|---|---|---|
| 4,317,364 A | 3/1982 | Asano et al. |
| 5,123,016 A | 6/1992 | Muller et al. |
| 6,981,179 B1 | 12/2005 | Shigemasa et al. |

(Continued)

OTHER PUBLICATIONS

Pritzkau, "Method and Apparatus for Providing Preloaded Non-Volatile Memory Content"; U.S. Appl. No. 13/091,933, filed Apr. 21, 2011; Total pp. 22.

*Primary Examiner* — Daniel F. McMahon
(74) *Attorney, Agent, or Firm* — Dicke, Billig & Czaja, PLLC

(57) ABSTRACT

Methods of managing systems comprising a processor and a memory device external to the processor, including exposing the memory device to temperature levels associated with soldering, starting up the memory device and testing pre-programmed data using control circuitry of the memory device. When results of the testing indicate repair of the pre-programmed data should be performed, issuing a command from the processor to the memory device indicative of a desire for the memory device to repair the pre-programmed data, and in response to the memory device receiving the command, repairing the pre-programmed data using the control circuitry of the memory device.

20 Claims, 6 Drawing Sheets

(56) References Cited

U.S. PATENT DOCUMENTS

| | | | |
|---|---|---|---|
| 7,200,786 B2 | 4/2007 | Cheng et al. | |
| 7,269,766 B2 | 9/2007 | Slobodnik et al. | |
| 7,509,543 B2* | 3/2009 | Mohr | G11C 17/18 |
| | | | 365/201 |
| 7,668,612 B1* | 2/2010 | Okkonen | G06F 8/65 |
| | | | 700/95 |
| 7,730,357 B2 | 6/2010 | Micheloni et al. | |
| 8,230,274 B2 | 7/2012 | Fujiwara et al. | |
| 2004/0216011 A1* | 10/2004 | Co | G11C 29/48 |
| | | | 714/42 |
| 2005/0289287 A1 | 12/2005 | Shin et al. | |
| 2007/0186135 A1* | 8/2007 | Flachs | G06F 11/1044 |
| | | | 714/752 |
| 2009/0070654 A1* | 3/2009 | Flachs | G06F 11/1044 |
| | | | 714/758 |
| 2009/0316501 A1* | 12/2009 | Bunker | G06F 11/1004 |
| | | | 365/189.17 |
| 2010/0235617 A1 | 9/2010 | Chen | |
| 2012/0204077 A1* | 8/2012 | D'Abreu et al. | G06F 11/1012 |
| | | | 714/755 |
| 2012/0272107 A1 | 10/2012 | Cadloni | |
| 2013/0007542 A1* | 1/2013 | Carman | G06F 11/106 |
| | | | 714/710 |
| 2013/0031319 A1* | 1/2013 | Gorman | H03M 7/30 |
| | | | 711/157 |
| 2014/0006887 A1* | 1/2014 | Greene | G01R 31/3177 |
| | | | 714/727 |
| 2016/0350183 A1* | 12/2016 | Lien | G11C 7/04 |

* cited by examiner

AUTORECOVERY AFTER MANUFACTURING/SYSTEM INTEGRATION

RELATED APPLICATIONS

This Application is a Continuation of U.S. application Ser. No. 14/552,863, titled "AUTORECOVERY AFTER MANUFACTURING/SYSTEM INTEGRATION," filed Nov. 25, 2014, now U.S. Pat. No. 9,552,895, issued on Jan. 24, 2017, which is a Continuation of U.S. application Ser. No. 13/767,389, titled "AUTORECOVERY AFTER MANUFACTURING/SYSTEM INTEGRATION," filed Feb. 14, 2013, now U.S. Pat. No. 8,904,250, issued on Dec. 2, 2014, which are commonly assigned and incorporated herein by reference.

TECHNICAL FIELD

The present embodiments relate generally to memory and a particular embodiment relates to autorecovery after manufacturing/system integration.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates, trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules.

When an embedded memory module is integrated with a system, such as a mobile telephone, tablet or the like, the module is typically soldered to a circuit board. The high temperatures associated with soldering can increase the bit error rate of the memory module and/or compromise integrity of the pre-programmed data on the memory module.

DETAILED DESCRIPTION

Figure 1:
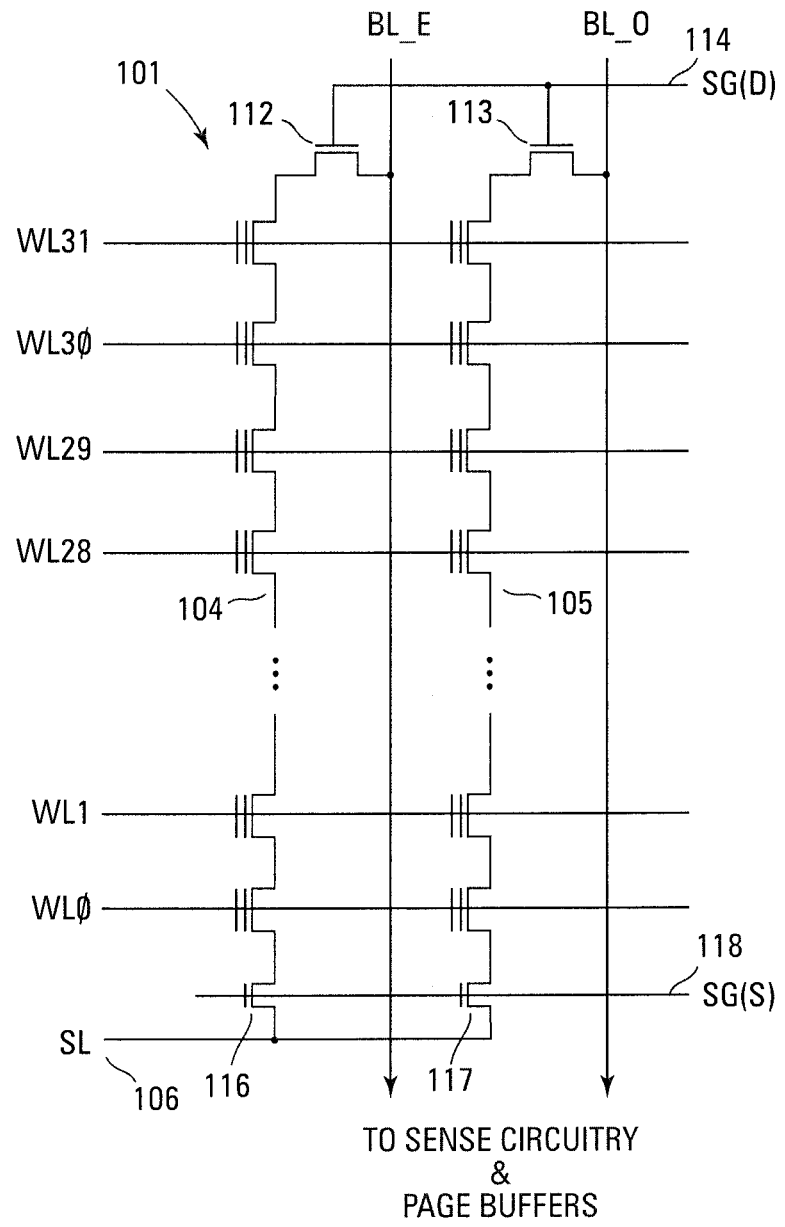
FIG. 1 is a schematic diagram of one embodiment of a portion of a NAND architecture memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Non-volatile memory can utilize different architectures including NOR and NAND. The architecture designation is derived from the logic used to read the devices. In NOR architecture, a logical column of memory cells is coupled in parallel with each memory cell coupled to a data line, such as those typically referred to as bit lines. In NAND architecture, a column of memory cells is coupled in series with only the first memory cell of the column coupled to a bit line.

FIG. 1 illustrates a schematic diagram of one embodiment of a portion of a NAND architecture memory array 101 comprising series strings of non-volatile memory cells. This figure is for purposes of illustration of a typical memory array only as a method for self-test and self-repair operations in a memory device and is not limited to the illustrated NAND architecture.

The memory array 101 comprises an array of non-volatile memory cells (e.g., floating gate) arranged in columns such as series strings 104, 105. Each of the cells is coupled drain to source in each series string 104, 105. An access line (such as those typically referred to as word lines) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry and page buffers that detect and store the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

In a typical programming of the memory array, each memory cell is individually programmed as either a single level cell (SLC) or a multiple level cell (MLC). A cell's threshold voltage ($V_t$) can be used as an indication of the data stored in the cell. For example, in an SLC memory device, a $V_t$ of 2.5V might indicate a programmed cell while a $V_t$ of −0.5V might indicate an erased cell. In an MLC memory device, multiple $V_5$ ranges can each indicate a different state by assigning a bit pattern to a specific $V_t$ range.

Figure 2:
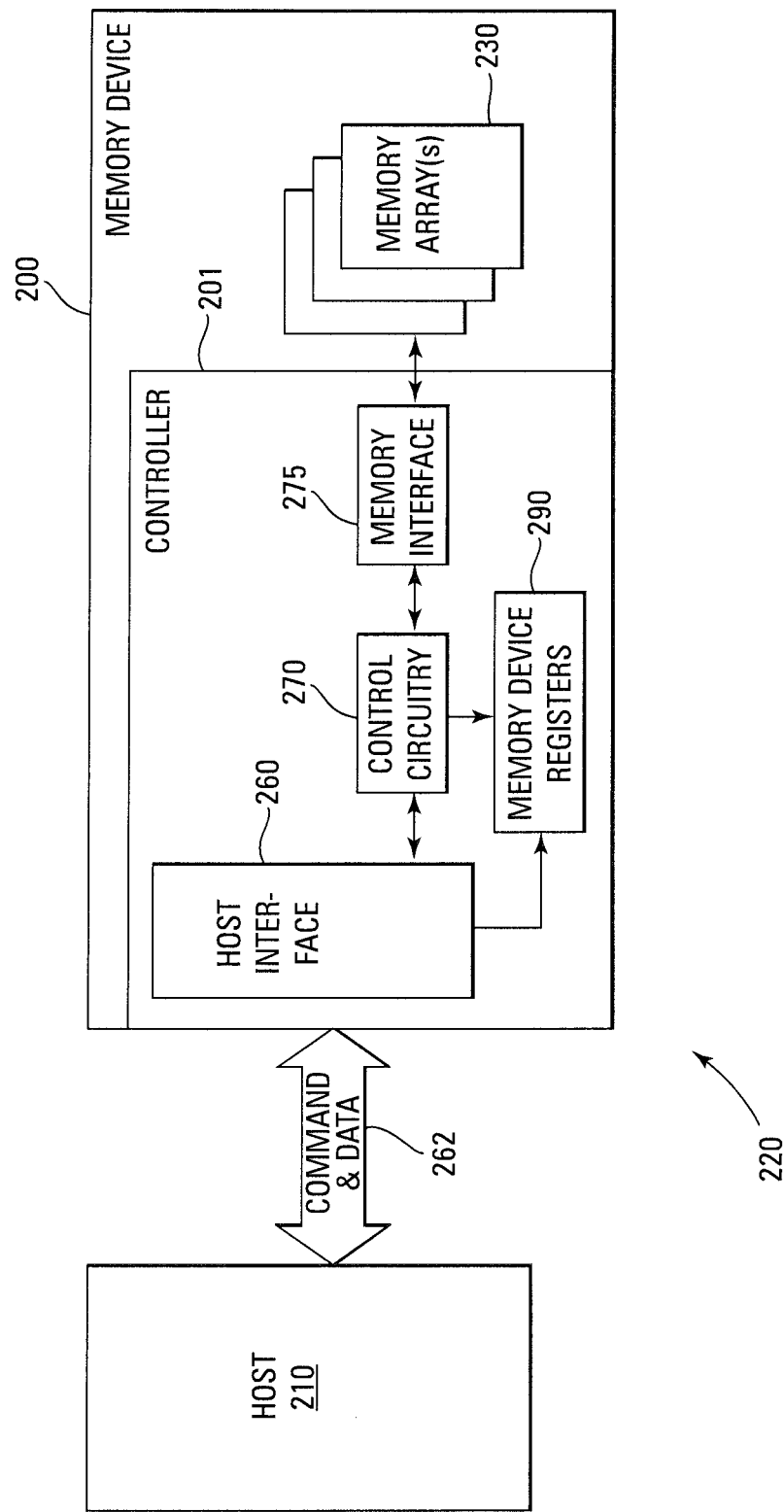
FIG. 2 is a block diagram of one embodiment of a system that can incorporate a non-volatile memory device using a method for host controlled enablement of background operations.

FIG. 2 illustrates a functional block diagram of a memory device 200 that can include a memory array architecture such as illustrated in FIG. 1. The memory device 200 is coupled to an external host 210 that acts as some type of controller. The host 210 can be configured to communicate commands (e.g., write, read), control signals, and data with the memory device 200 over a command and data bus 262 that connects the host 210 with the memory device 200. The memory device 200 and the host 210 form part of a system 220. Memory devices of this type are often referred to as managed memory devices.

The memory device 200 includes one or more arrays 230 of memory cells (e.g., NAND architecture non-volatile memory cells). The memory array 230 is arranged in banks of word line rows and bit line columns. In one embodiment, the columns of the memory array 230 comprise series strings of memory cells. One example of a portion of such an array is illustrated in FIG. 1.

Host interface circuitry 260 provides an interface between the memory device 200 and the host 210. The host interface circuitry 260 might include circuitry such as buffers and registers.

Control circuitry 270, coupled to the host interface 260, operates in response to control signals from the host 210. These signals are used to control the operations of the memory array(s) 230, including data sense (e.g., read), data write (e.g., program), and erase operations. The control circuitry 270 may be a state machine, a sequencer, or some other type of control circuitry that is configured to control generation of memory control signals. In one embodiment, the control circuitry 270 is configured to control execution of the method for self-test and self-repair of the memory device.

Memory interface circuitry 275, coupled between the control circuitry 270 and the memory array(s) 230, provides bidirectional data communication between the control circuitry 270 and the memory array(s) 230. The memory interface circuitry 275 can include write circuitry, read circuitry, decoders, and buffers.

Memory device registers such as those described below are shown in FIG. 2. For example, memory device registers 290, coupled to the host interface 260 and the control circuitry 270, can be a part of the control circuitry 270 or separate from the control circuitry 270. The registers 290, as subsequently described, can be used to store control data for operation of a method for host controlled initiation of memory device self-testing and memory device self-repair. In one embodiment, the control circuitry 270 controls writing to and reading from the memory device registers 290 as directed by control signals from the host 210 over the command and data bus 262, as subsequently described. In another embodiment, the host 210 can write directly to and read directly from the registers 290 without control circuitry 270 intervention.

In one embodiment, the host interface 260, the control circuitry 270, the memory interface 275, and the memory device registers 290 are part of the memory device controller 201. Alternate embodiments of the controller 201 can include only a subset of these blocks or additional memory device circuitry.

Figure 3:
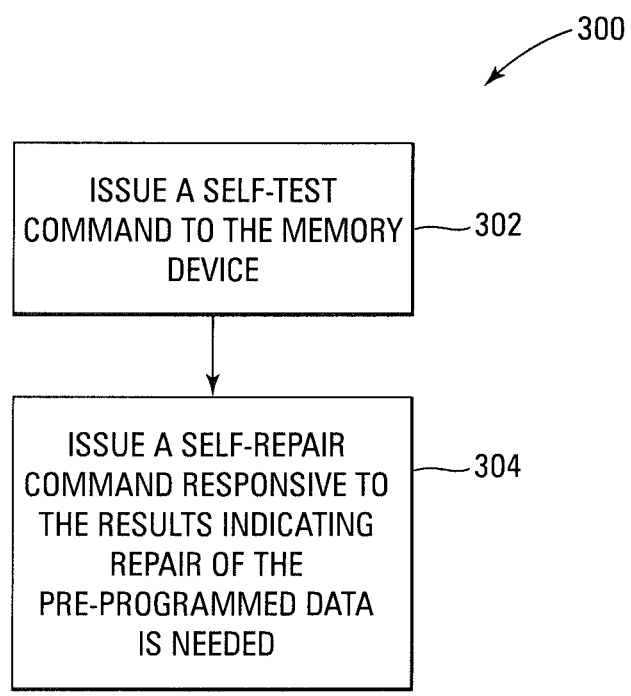
FIG. 3 is a flow chart diagram of an embodiment of a method for autorecovery.
Figure 4:
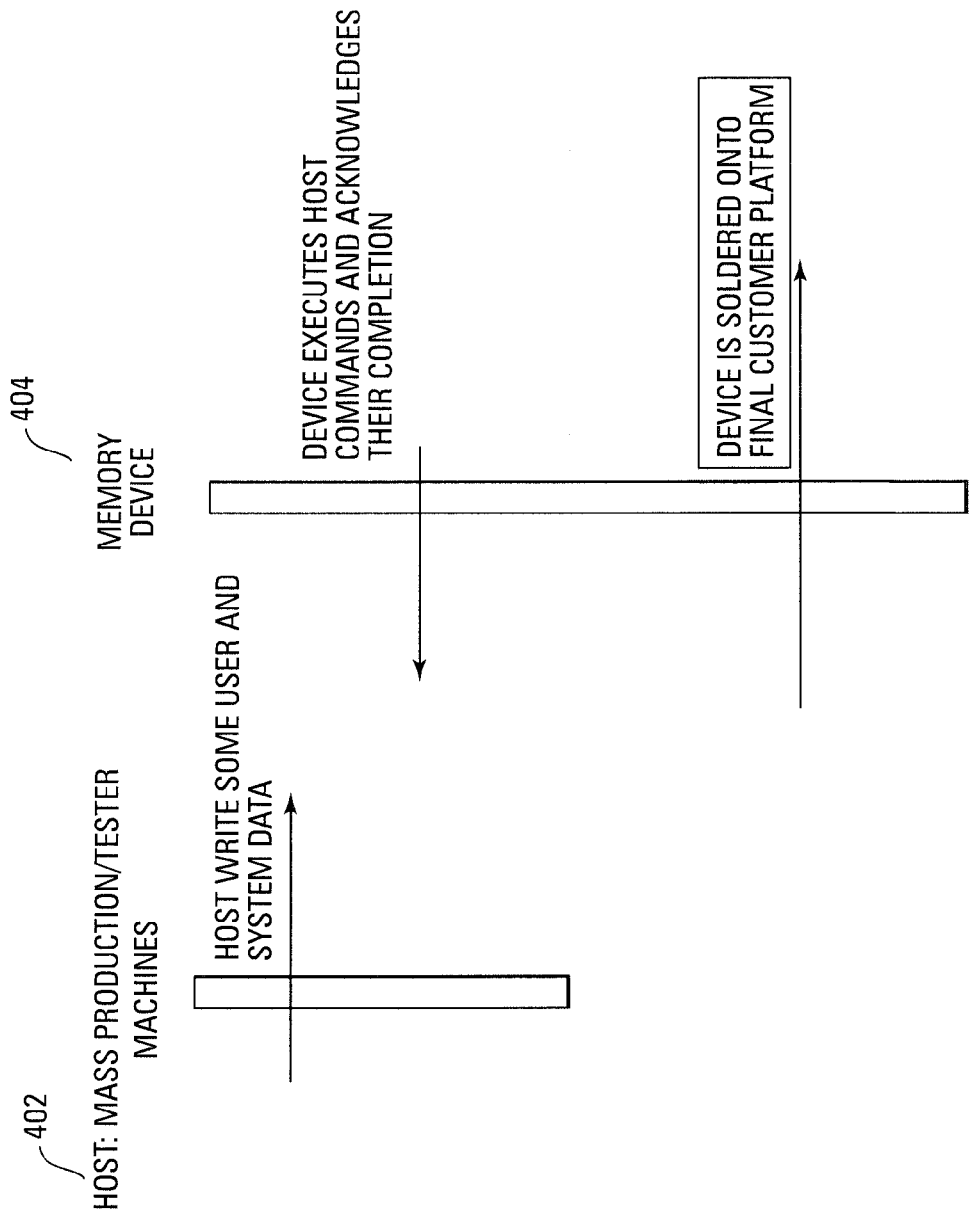
FIG. 4 is a diagram of a check and configuration phase of the method of FIG. 3.

A method of producing a device with a memory is shown in one embodiment in FIGS. 3 and 4. FIG. 3 shows a flow chart of method 300, and FIG. 4 shows operation of the interaction between a host 402 and a memory device 404 as part of the method for host enabled initiation of memory device self-testing and memory device self-repair. The diagram of FIG. 4 is for the purpose of illustration only as the interaction between the host and the memory device can occur differently.

Figure 6:
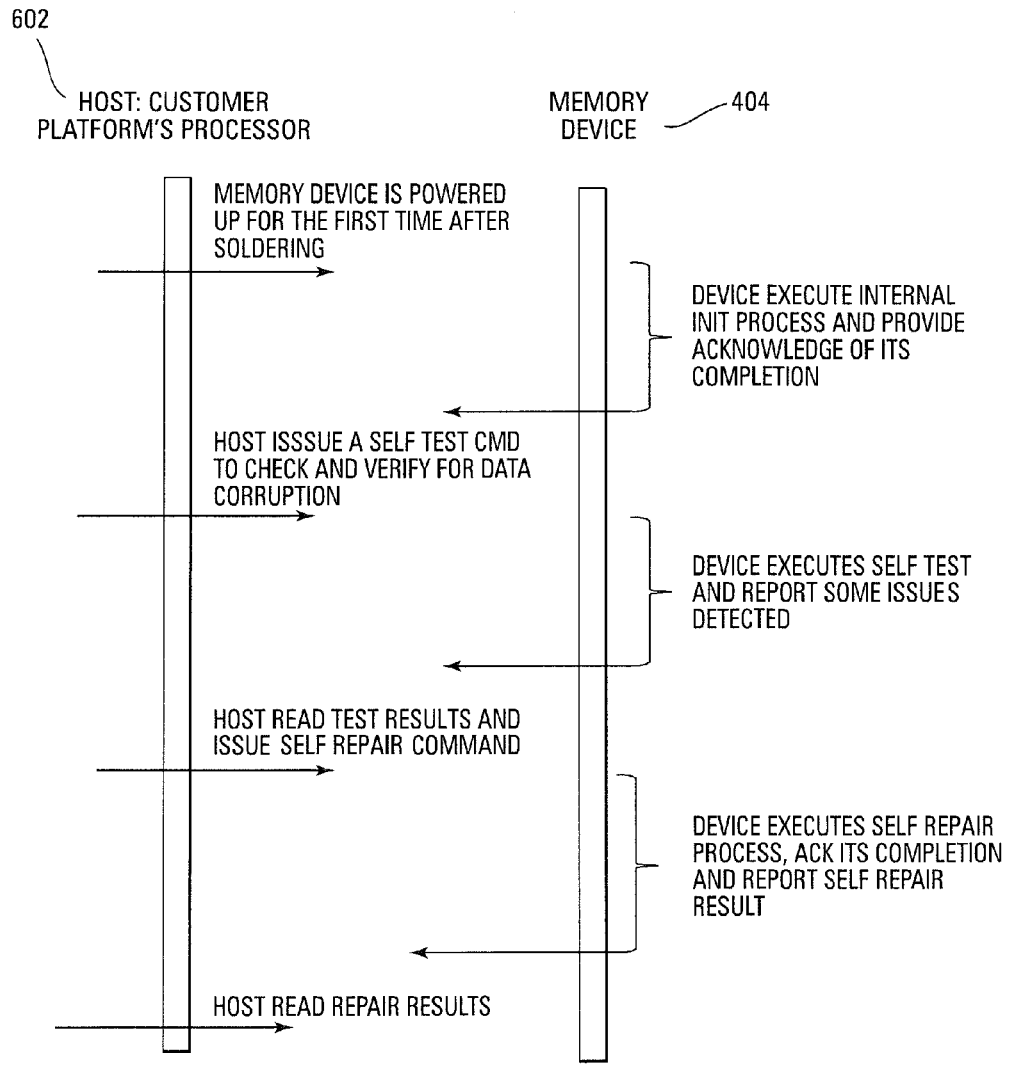
FIG. 6 is a diagram of a check and configuration phase of the method of FIG. 5.

Once the initial content is programmed and acknowledged, the part is soldered to a final customer platform. This is often accomplished at a customer location, with the pre-programmed memory device shipped to a customer who assembles it into a final system platform, by soldering. Once assembled into a separate customer platform, the host is typically now represented by the customer platform's processor (e.g., host 602 as shown in FIG. 6), which is in one embodiment part of the final customer platform (e.g., tablet, mobile phone, etc.), but in another embodiment may be that same external host (e.g., host 402 as shown in FIG. 4). The host may be used for initiating self-test and self-repair on the memory device, as described further below.

When the device is soldered to the separate customer platform, it is possible that the high temperatures associated with the soldering may compromise the data integrity and/or increase the bit error rate in the memory. Should this happen, the device may not be reliable.

Method 300 for testing a pre-programmed memory device after it has been assembled into a final customer platform comprises issuing a self-test command to the memory device in block 302, and issuing a self-repair command responsive to the results indicating repair of the pre-programmed data is needed in block 304. The memory device reports results of a self-test of pre-programmed data executed responsive to receiving the self-test command in one embodiment. The host in method 300 is, in one embodiment, represented by, for example, a mass production or tester machine that initiates commands to write data to the memory device before its final assembly into a separate customer platform, e.g., a mobile telephone, table device, or the like. Devices are typically prepared with some initial content in large numbers. The host issues commands to initiate programming of the initial content, and the device executes the host commands and acknowledges their completion.

Figure 5:
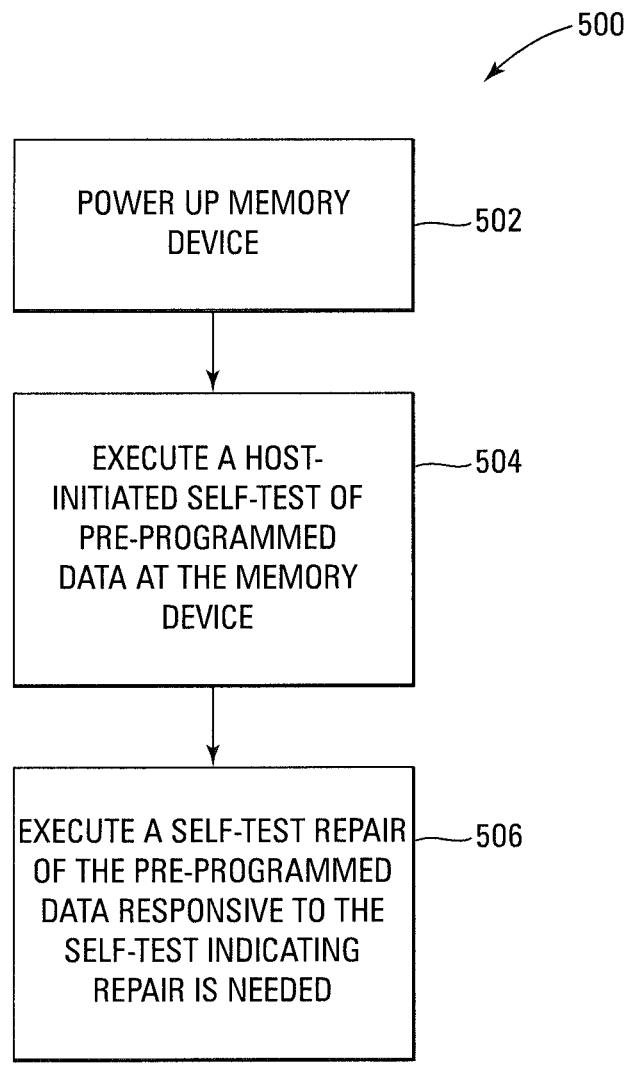
FIG. 5 is a flow chart diagram of an embodiment of another method for autorecovery.

Another method of post-production testing and repair of a memory is shown in one embodiment in FIGS. 5 and 6. FIG. 5 shows a flow chart of method 500, and FIG. 6 shows operation of the interaction between a host 602, which may be a customer platform's processor or the like, and a memory device 404 as part of the method for host enabled initiation of memory device self-testing and memory device self-repair. The diagram of FIG. 6 is for the purpose of illustration only as the interaction between the host and the memory device can occur differently.

Method 500 of testing a pre-programmed memory device after it has been assembled into a final customer platform comprises, in one embodiment, powering up the memory device in block 502, executing a host-initiated self-test of pre-programmed data at the memory device in block 504, and executing a self-repair of the pre-programmed data responsive to the self-test indicating repair is needed in block 506.

Method 500 may further comprise, in other embodiments, executing an internal initialization process by the memory device and acknowledging completion of the initialization process to the host, reporting results for the executed self-test to the host. For each of these embodiments, the host receives and reads the results. Further, in another embodiment, the host issues a self-repair command responsive to the reported results indicating repair is needed, and receives and reads the results of device self-repair. Executing a host-initiated self-test comprises in one embodiment executing the host-initiated self-test responsive to receiving the self-test command.

Various embodiments may use registers to store information allowing activation of the device self-test and self-repair procedures. Such registers may be existing registers or may be registers added to store the particular data used for activation of the self-test and self-repair procedures. Further registers may be used to store results of self-tests and/or to let the host know the results of the self-test, or to inform the host of results of a self-repair.

In one embodiment, device level registers may be software registers or hardware registers. Implementation and use of software registers is known, and such implementation is within the scope of one of ordinary skill in the art. Examples of registers that may be used with some embodiments of the disclosure include writable registers used by the host to initiate a memory device self-test procedure, or to initiate a memory device self-repair procedure. Further examples of registers that may be used with some embodiments of the disclosure include readable registers read by the host to allow the host to learn results of a self-test procedure. As nearly every memory device contains a number of registers, whether existing registers may be used, or whether new software or hardware registers may be used, will depend on specific implementations, and are each within the scope of the disclosure.

It should be understood that the process for self-test and self-repair initiated by the host may be performed once at the first start-up of the device after soldering, but may also be performed on a regular or intermittent schedule. For example, the host initiated process for self-test and self-repair may be performed at every start-up of the device, or may be performed at an increasing frequency over the life of the memory device, with more frequent initiation as the memory device approaches its end-of-life cycle. Such variations are within the scope of the disclosure.

CONCLUSION

In summary, one or more embodiments of a method for host initiation of self-testing and/or self-repair in a memory device can provide correction of errors due to the heat of soldering a memory device to a final platform. Host initiation of self-test and/or self-repair includes a host initiating a self-test command to a managed memory device, the host reading the results of the self-test, and the host initiating a self-repair command to the managed memory device when the self-test results indicate that repair should be performed.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method of managing a system comprising a processor and a memory device external to the processor, the method comprising:
 exposing the memory device to heat of soldering the memory device to a platform of the system, then powering up the memory device;
 testing pre-programmed data using control circuitry of the memory device, wherein the pre-programmed data comprises data programmed to the memory device prior to exposing the memory device to the heat of soldering the memory device to the platform;
 in response to results of the testing indicating repair of the pre-programmed data should be performed, issuing a command from the processor to the memory device instructing the memory device to repair the pre-programmed data; and
 in response to the memory device receiving the command, repairing the pre-programmed data using the control circuitry of the memory device.

2. The method of claim 1, wherein powering up the memory device comprises powering up the memory device for a first time after exposing the memory device to the heat of soldering the memory device to the platform.

3. The method of claim 2, wherein testing the pre-programmed data comprises testing the pre-programmed data in response to powering up the memory device.

4. The method of claim 1, wherein testing the pre-programmed data comprises testing the pre-programmed data in response to a different command received by the memory device from the processor instructing the memory device to test the pre-programmed data.

5. The method of claim 1, wherein testing the pre-programmed data comprises testing the pre-programmed data as part of an initialization process of the memory device.

6. The method of claim 1, further comprising storing the results of the testing to registers of the memory device.

7. The method of claim 6, further comprising the processor reading the results of the testing from the registers of the memory device to determine whether the results of the testing indicate that repair of the pre-programmed data should be performed.

8. The method of claim 1, further comprising reporting the results of the testing to the processor for determining whether the results of the testing indicate repair of the pre-programmed data should be performed.

9. The method of claim 1, wherein exposing the memory device to the heat of soldering the memory device to the platform comprises soldering the memory device to a platform configured to comprise the processor.

10. A method of managing a system comprising a processor and a memory device external to the processor, the method comprising:
 exposing the memory device to heat of soldering the memory device to a platform of the system;
 after exposing the memory device to the heat of soldering the memory device to the platform, powering up the memory device;
 issuing a first command from the processor to the memory device instructing the memory device to test pre-programmed data of the memory device, wherein the pre-programmed data comprises data first programmed to the memory device prior to exposing the memory device to the heat of soldering the memory device to the platform;
 in response to the memory device receiving the first command, testing the pre-programmed data using control circuitry of the memory device;
 in response to results of the testing indicating repair of the pre-programmed data should be performed, issuing a second command from the processor to the memory device instructing the memory device to repair the pre-programmed data; and
 in response to the memory device receiving the second command, repairing the pre-programmed data using the control circuitry of the memory device.

11. The method of claim 10, further comprising storing the results of the testing to the memory device.

12. The method of claim 10, further comprising either the processor reading the results of the testing from registers of the memory device to determine whether the results of the testing indicate that repair of the pre-programmed data should be performed, or the memory device reporting the results of the testing to the processor for determining whether the results of the testing indicate repair of the pre-programmed data should be performed.

13. The method of claim 10, further comprising issuing the first command at a powering up of the memory device.

14. The method of claim 13, further comprising re-issuing the first command at each subsequent powering up of the memory device.

15. The method of claim 10, further comprising re-issuing the first command on a regular or intermittent schedule.

16. The method of claim 15, wherein re-issuing the first command on the intermittent schedule comprises re-issuing the first command on a basis of increasing frequency over a life of the memory device.

17. A method of managing a system comprising a processor and a memory device external to the processor, the method comprising:
  exposing the memory device to heat of soldering the memory device to a platform of the system;
  powering up the memory device for a first time after exposing the memory device to the heat of soldering the memory device to the platform;
  testing pre-programmed data of the memory device as part of an initialization process of the memory device, wherein the pre-programmed data comprises data first programmed to the memory device prior to exposing the memory device to the heat of soldering the memory device to the platform;
  in response to results of the testing indicating, repair of the pre-programmed data should be performed, issuing a command from the processor to the memory device instructing the memory device to repair the pre-programmed data; and
  in response to the memory device receiving the command, repairing the pre-programmed data using the control circuitry of the memory device.

18. The method of claim 17, further comprising testing the pre-programmed data of the memory device as part of an initialization process of the memory device for a subsequent powering up of the memory device.

19. The method of claim 18, further comprising testing the pre-programmed data of the memory device as part of an initialization process of the memory device for each subsequent powering up of the memory device.

20. The method of claim 17, further comprising either the memory device storing the results of the testing to registers of the memory device and the processor reading the results of the testing from the registers of the memory device to determine whether the results of the testing indicate that repair of the pre-programmed data should be performed, or the memory device reporting the results of the testing to the processor for determining whether the results of the testing indicate repair of the pre-programmed data should be performed.

* * * * *